United States Patent [19]

Kawai et al.

[11] Patent Number: 4,729,024

[45] Date of Patent: Mar. 1, 1988

[54] SYNCHRONIZING PULSE SIGNAL GENERATION DEVICE

[75] Inventors: Hisashi Kawai, Kanagawa; Makoto Masunaga; Tuguhide Sakata, both of Tokyo; Masahiro Takei; Kenichi Nagasawa, both of Kanagawa, all of Japan

[73] Assignee: Canon Kabushiki Kaisha, Tokyo, Japan

[21] Appl. No.: 840,942

[22] Filed: Mar. 18, 1986

[30] Foreign Application Priority Data

Mar. 19, 1985 [JP] Japan ............... 60-055150
May 27, 1985 [JP] Japan ............... 60-112231
May 29, 1985 [JP] Japan ............... 60-116217
May 29, 1985 [JP] Japan ............... 60-080249[U]

[51] Int. Cl.[4] .................. H04N 5/04; H04N 5/06
[52] U.S. Cl. .................... 358/153; 358/148; 358/150; 358/158; 307/511; 307/516; 328/63; 328/72

[58] Field of Search ............... 358/148, 149, 150, 158, 358/319, 320, 337, 153; 331/20, 25; 325/108, 111, 118, 119, 120; 307/511, 516, 525, 526, 527; 328/63, 72, 74

[56] References Cited

U.S. PATENT DOCUMENTS 4,611,230 9/1986 Nienaber ............... 358/158
4,616,259 10/1986 Moran et al. ............... 358/150

*Primary Examiner*—James J. Groody
*Assistant Examiner*—Michael D. Parker
*Attorney, Agent, or Firm*—Toren, McGeady & Associates

[57] ABSTRACT

A synchronizing pulse signal generation device separates horizontal and vertical synchronizing signals from a video signal; generates a clock signal which is phase locked relative to the phase of the horizontal synchronizing signal; and generates, by using the clock signal, a synchronizing pulse signal which is phase locked relative to the vertical and horizontal synchronizing signals.

14 Claims, 13 Drawing Figures

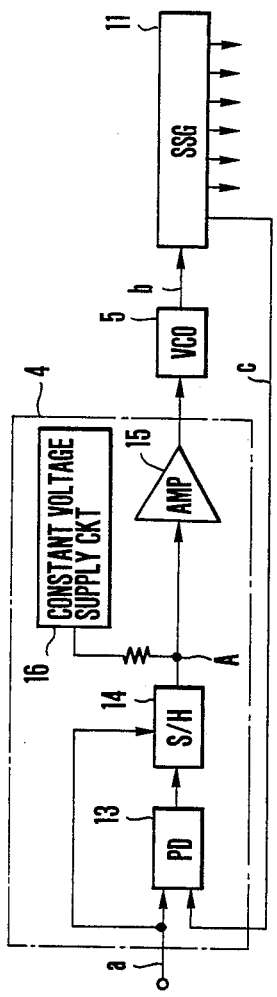
F I G. 3
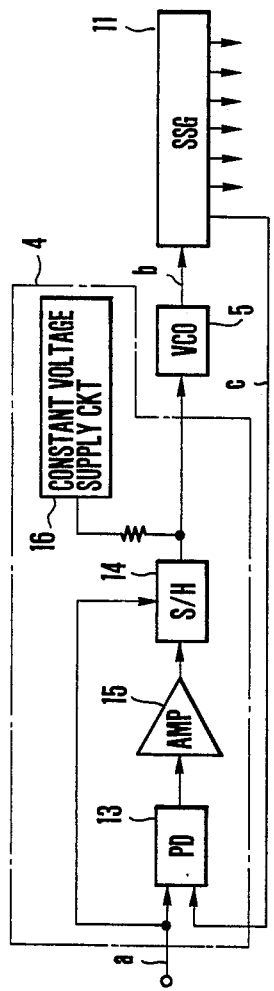
F I G. 4
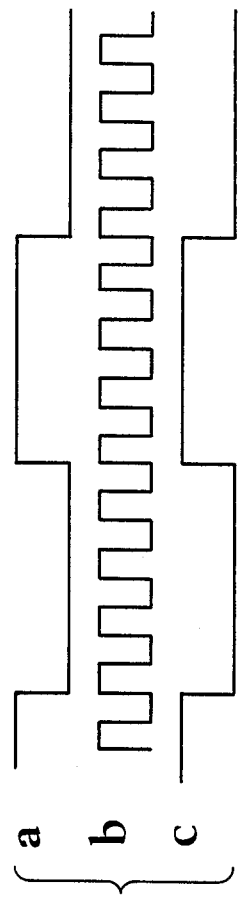
F I G. 5

SYNCHRONIZING PULSE SIGNAL GENERATION DEVICE

BACKGROUND OF THE INVENTION

1. Field of the Invention

This invention relates to a synchronizing pulse signal generation device for generating a pulse signal in synchronism with the horizontal and vertical synchronizing signal contained in a video signal.

2. Description of the Prior Art

Generally, a video signal contains a horizontal synchronizing signal (hereinafter will be called H-Sync signal) and a vertical synchronizing signal (hereinafter will be called V-Sync signal). Apparatuses handling such video signals, therefore, often utilize a pulse signal which is synchronized with these two kinds of synchronizing signals. Heretofore, a device for generating a pulse signal of this kind has been arranged to adjust the phase of the pulse signal to that of the video signal by resetting, with the H-Sync and V-Sync signals separated from the video signal, a frequency divider which forms pulses by frequency dividing clock pulses produced from a free-running oscillator.

However, the clock pulses produced by the oscillator of the pulse signal generating device are not always in synchronism with the video signal. Hence, the pulses may possibly be produced at a maximum time-base error corresponding to one clock pulse depending on the timing of the above-stated resetting operation. In order to minimize the time-base error, the oscillator must be arranged to oscillate at a very high frequency. This, however, necessitate the provision of an additional circuit element for high frequency at each applicable part of the apparatus. Further, the use of a high frequency signal brings about a serious adverse effect on peripheral circuits. Then, some suitable shielding arrangement becomes necessary for preventing such an adverse effect.

SUMMARY OF THE INVENTION

In view of the problems of the prior art mentioned above, it is an object of the present invention to provide a synchronizing pulse signal generating device capable of generating a pulse signal which is precisely in synchronism with the two kinds of synchronizing signals without necessitating the use of an excessively high frequency.

Under this object, a synchronizing pulse signal generation device according to this invention comprises: first means for forming clock pulses phase-locked relative to a first periodic signal; and second means which uses the clock pulses together with a second periodic signal of a longer period than the first periodic signal for generating a pulse signal phase-locked relative to both the first and second periodic signals.

It is another object of this invention to provide a synchronizing pulse signal generation device capable of stably operating even in the event of occurrence of any drop-out in a synchronizing signal.

Under that object, a synchronizing pulse signal generation device according to this invention comprises: phase comparison means which is arranged to generate a phase error signal at a level corresponding to a phase difference between two input signals; a variable frequency oscillator which has the oscillation frequency thereof controlled on the basis of the phase error signal; control means for controlling the variable frequency oscillator by selectively using the level of the phase error signal and a predetermined level value; supply means for supplying a periodic signal to the phase comparison means as one of the input signals of the latter; and means for generating, by using the oscillation output of the variable frequency oscillator, a first pulse signal of a period equal to that of the periodic signal, the first pulse signal being supplied to the phase comparison means as the other input signal of the phase comparison means.

It is a further object of this invention to provide a video signal reproducing apparatus capable of adequately performing a signal processing operation even in the event of occurrence of a disorder in a synchronizing signal.

Under the above-stated object, a video signal reproducing apparatus according to this invention comprises: reproducing means for reproducing a video signal recorded on a recording medium; signal processing means for processing the video signal reproduced by the reproducing means and for producing a processed video signal; horizontal synchronizing signal separating means for separating a horizontal synchronizing signal from the video signal reproduced by the reproducing means; clock pulse generating means for generating clock pulses which are phase-locked relative to the horizontal synchronizing signal separated from the video signal by the separating means; count means for counting the clock pulses; timing pulse generating means for generating, on the basis of a counted value of the count means, timing pulses which determine timing for the operation of the signal processing means; and resetting means for resetting the count means according to the horizontal synchronizing signal.

The objects, other than those mentioned above, and features of this invention will become apparent from the following detailed description of embodiments thereof taken in connection with the accompanying drawings.

BRIEF DESCRIPTION OF THE DRAWINGS

FIG. 3 is a diagram showing another example of the details of arrangement around the phase-locked circuit of FIG. 1.

FIG. 4 is a diagram showing a further example of the details of an arrangement of the phase-locked circuit.

FIG. 5 is a timing chart showing the waveforms at the outputs of various parts shown in FIG. 3.

DETAILED DESCRIPTION OF THE PREFERRED EMBODIMENTS

Figure 1:
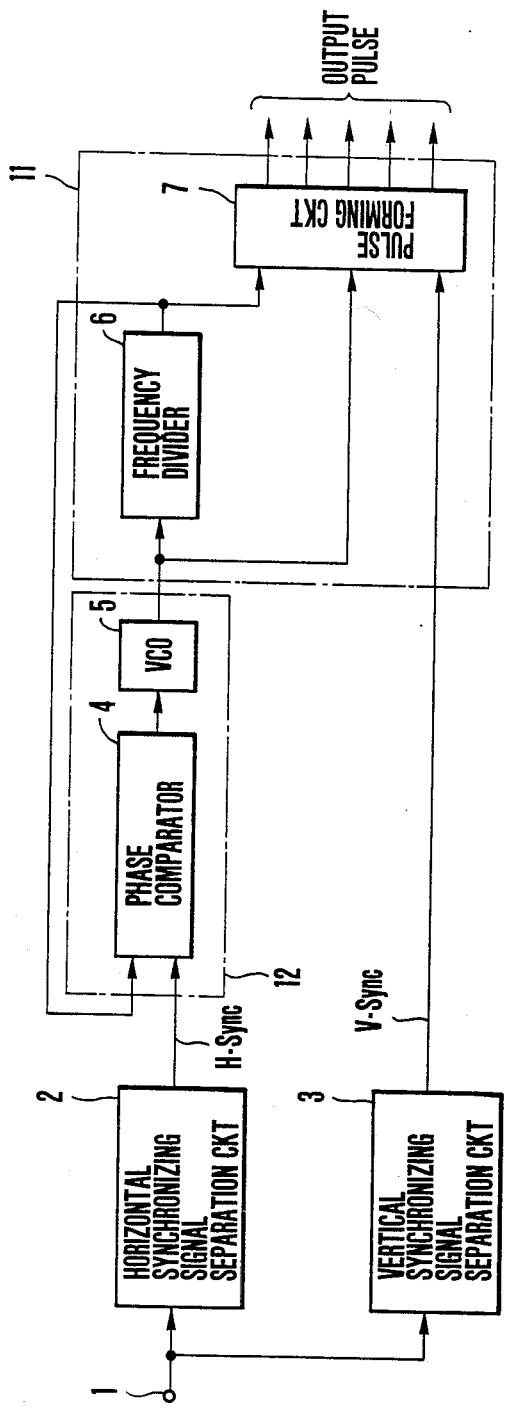
FIG. 1 is a diagram showing a synchronizing pulse signal generation device arranged according to this invention as an embodiment thereof.

FIG. 1 shows a synchronizing pulse signal generation device arranged according to this invention as an embodiment thereof. The illustration includes a terminal 1 which is arranged to receive a video signal; a horizontal synchronizing signal separation circuit 2 which is arranged to separate the H-Sync signal from the incoming video signal; a vertical synchronizing signal separation circuit 3 which is arranged to separate the V-Sync signal from the incoming video signal; a phase comparator 4; a voltage-controlled oscillator (VCO) 5 which is arranged to oscillate at a frequency according to the level of an error signal produced from the phase comparator 4 and, more particularly, according to the low frequency component of the error signal; and a frequency divider 6 which divides the frequency of the output of the VCO 5. The output of the frequency divider 6 is fed back to the phase comparator 4 to be phase compared with the H-Sync signal. A pulse forming circuit 7 is arranged to form pulses by using the output of the VCO 5, that of the frequency divider 6 and the V-Sync signal.

The H-Sync signal, which is separated by the horizontal synchronizing signal separation circuit 2, is phase compared with a signal which has a center frequency at a horizontal scanning frequency fH generated from the frequency divider 6. The error signal obtained from the phase comparator 4 is used for controlling the VCO 5 which oscillates at a center frequency nfH (wherein n represents an integer) in such a way as to make the output of the frequency divider 6 a signal which is equal to the H-Sync both in phase and frequency. By this, the output signal of the frequency divider 6 is adjusted to rise at the same timing, for example, as the rise of the H-Sync signal. A phase-locked circuit 12 is formed jointly by the phase comparator 4 and the VCO 5. A reference numeral 11 denotes a synchronizing pulse signal generating circuit (hereinafter referred to as SSG).

The pulse forming circuit 7 uses the signal produced from the VCO 5 as clock pulses and forms various pulse signals with the output signal of the frequency divider 6 arranged to coincide with the rise of the H-Sync signal contained in the video signal. Meanwhile, the V-Sync signal, which is separated by the vertical synchronizing signal separation circuit 3, is also supplied to the pulse forming circuit 7. The V-Sync signal is arranged to be sampled every time the output signal of the frequency divider 6 rises, and to be detected in synchronism with the H-Sync signal. With the V-Sync signal thus detected, a pulse forming signal which is synchronized with the V-Sync signal is obtained. Then, a pulse signal which is synchronized with the pulse forming signal and the output signal of the frequency divider 6 is obtained. In this instance, since the pulse forming V-Sync signal is in synchronism with the H-Sync signal, any fluctuations of the V-Sync signal, which is separated from the video signal, within a range of under $\pm\frac{1}{2}$ horizontal scanning period brings about no adverse effect on the output signal of the pulse forming circuit 7 because the output signal of the frequency divider 6 always serves as a reference signal.

With the embodiment arranged in the manner described above, it is possible to obtain a pulse signal which is perfectly in synchronism with the H-Sync and V-Sync signals of the input video signal. In this instance, the frequency of the clock pulses may be arranged to be several times as high as the H-Sync signal. In other words, the arrangement using clock pulses synchronized with the H-Sync signal, permits use of clock pulses which are not at any specially high frequency but are capable of only meeting a certain degree of phase precision required for the pulse signal to be produced. Further, since the clock pulses are in synchronism with the video signal, the pulse signal can be formed with a very low degree of a time-base error.

Figure 2:
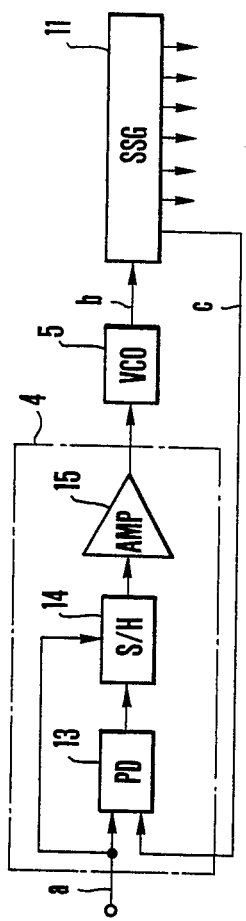
FIG. 2 is a diagram showing, by way of example, the details of an arrangement of a phase-locked circuit shown in FIG. 1.

The above-stated phase-locked circuit 12 is arranged as follows: FIG. 2 shows, by way of example, the arrangement of a portion of FIG. 1 including the phase-locked circuit 12 and parts around the phase-locked circuit 12. In FIG. 2, the same component elements as those shown in FIG. 1 are indicated by the same reference numerals. The illustration includes a phase difference detector 13 (hereinafter referred to as PD) which is arranged to compare the phase of a periodic input signal "a", such as the H-Sync signal or the like, with that of a periodic output signal "c" which is one of the outputs of an SSG 11 and is of the same frequency as the periodic input signal. Then, the PD 13 converts a phase difference obtained as a result of this comparison into a voltage. A sample-and-hold circuit 14 (hereinafter referred to as S/H circuit) is arranged to sample and hold the output voltage of the PD 13. An amplifier (hereinafter referred to as AMP) 15 is arranged to amplify the voltage thus sampled and held. The VCO 5, which is mentioned in the foregoing, is arranged to vary the frequency of the output pulses thereof according to the output of the AMP 15. The SSG 11, which is similar to the SSG of FIG. 1, is arranged to produce the output pulses of the VCO 5 at desired intervals and a desired duty ratio.

The phase-locked circuit, which is arranged as described above, operates as follows: when an input signal "a" is received, the PD 13 compares the phase of the input signal "a" with that of an output signal "c" which is one of the output signals of the SSG 11. Then, the PD 13 produces a signal representing a phase difference thus obtained. In that instance, the S/H circuit 14 repeats its sampling operation in synchronism with the input signal "a". Therefore, the output voltage of the S/H circuit 14, which is the input voltage of the AMP 15, is a voltage obtained by the sampling operation. In case that the input signal "a" is not received, the S/H circuit 14 does not sample. Then, the input voltage of the VCO 5 reaches either its upper limit value or a lower limit value due to the action of the AMP 15 which is disposed in between the PD 13 and the VCO 5. In the phase-locked circuit 11 of this type, the output of the PD is under no restriction when the input signal "a" is not received. Under that condition, the signal formed by frequency dividing the output of the VCO is unstable compared with the signal formed when the PD has the input signal "a". As a result, the period of the output pulse signal sometimes comes to vary to a great degree.

FIG. 3 shows another example of the phase-locked (PLL) circuit 11 and parts around it. The PLL circuit in this case is improved to solve the above-stated problem. Referring to FIG. 3, the illustration includes a constant voltage supply circuit 16 which is arranged to supply a certain constant voltage to the input terminal of the AMP 15 via a predetermined impedance. Further, in FIG. 3, reference numerals and symbols which are same as those used in FIG. 2 denote parts which are either the same as or similar to the corresponding parts of FIG. 2. The arrangement of FIG. 3 is the same as that of FIG. 2 with the exception of the addition of the circuit 16.

FIG. 5 shows the waveforms of the input signal "a", the output "b" of the VCO 5 and the output "c" of the SSG 11.

With the device arranged as shown in FIG. 3, when the input signal "a" is not received and no sampling is performed at the S/H circuit 14, the input of the AMP 15 is determined by the output voltage of the constant voltage supply circuit 16, because: The output impedance of the S/H circuit 14 is low at the same time of sampling and very high at the time of holding. Therefore, the output voltage of the constant voltage supply circuit 16 is amplified by the AMP 15 before it is supplied to the VCO 5. If this voltage is at about the same potential as the output voltage of the AMP 15 obtained when the phase of the output signal "c" of the SSG 11 is locked relative to the input signal "a", the VCO 5 produces pulses of about the same period as that of pulses produced when the phase of the output signal "c" of the SSG 11 is locked relative to the input signal "a" even if there is no input signal "a". Therefore, the SSG 11 is arranged to produce a signal of a waveform of FIG. 5 which is approximately phase-locked relative to the input signal "a".

Meanwhile, when the input signal "a", is received the input voltage of the AMP 15 becomes a sampled voltage in the same manner as in the case of FIG. 2 and is not influenced by the output voltage of the constant voltage supply circuit 16, because: The output impedance of the constant voltage supply circuit 16 has increased to a certain degree by then. In other words, at a point A representing the output terminal of the constant voltage supply circuit 16 and that of the S/H circuit 14, there obtains the following relation in the magnitude of impedance among the various output stages:

The output of the S/H 14 obtained at the time of sampling  <<  The output of the constant voltage supply circuit 16  <<  The output of the S/H 14 obtained at the time of holding Therefore, when there is the input signal "a", the operation of the phase-locked circuit 12 is stably carried out without being affected by the inserted constant voltage supply circuit 16. In the event of no input, signals can be produced from the SSG 11 at about the same period and duty cycle by virtue of the output voltage of the constant voltage supply circuit 16.

Further, if the AMP 15 has a high gain, the voltage supplied to the VCO comes to vary to a greater degree even if there is not much difference between the output voltage of the PD 13 obtained at the time of phase lock and the output voltage of the constant voltage supply circuit 16. To avoid this, therefore, a constant voltage supply circuit may be added on the output side of the AMP 15.

On account of this, in another example which is shown in FIG. 4, the AMP 15 is disposed in front of the S/H 14. In this case, the output of the constant voltage supply circuit 16, instead of that of the AMP 15, becomes effective as the input for the VCO 5 in the event of no input signal "a". This arrangement eliminates any adverse effect that arises in the absence of the input signal "a".

Figure 6:
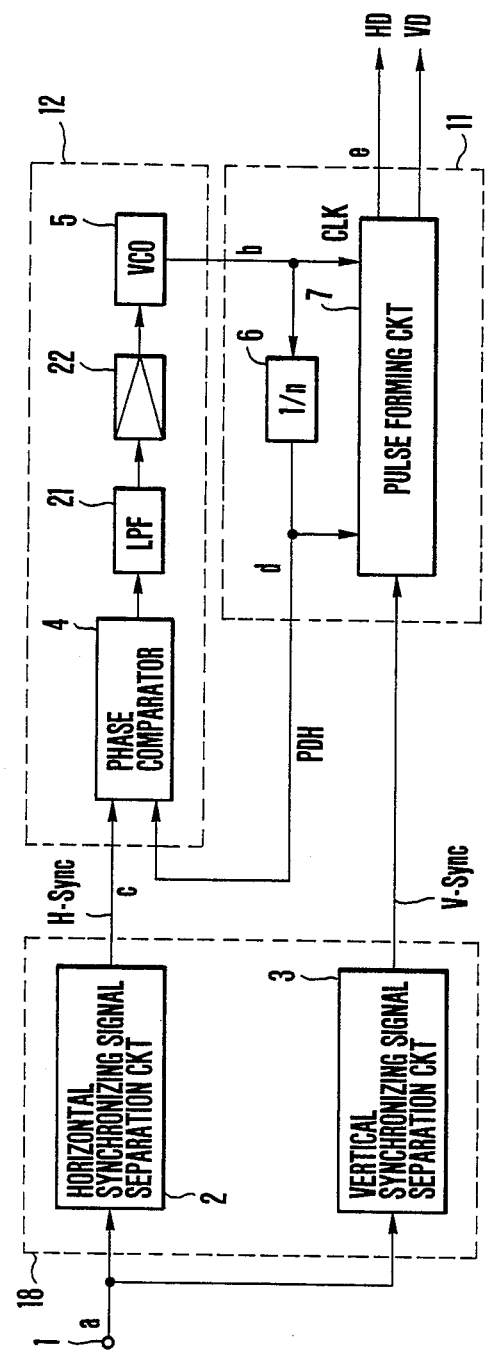
FIG. 6 is a diagram showing the phase-locked circuit of FIG. 1 in further detail.

FIG. 6 shows the details of arrangement of the phase locked circuit 12 included in the embodiment shown in FIG. 1. The same component elements as those shown in FIG. 1 are indicated by the same reference numerals. The output of the phase comparator 4 is supplied to a low-pass filter (LPF) 21 to have a high frequency component thereof removed there. The output of the LPF 21 controls the VCO 5 via an AMP 22.

Figure 7:
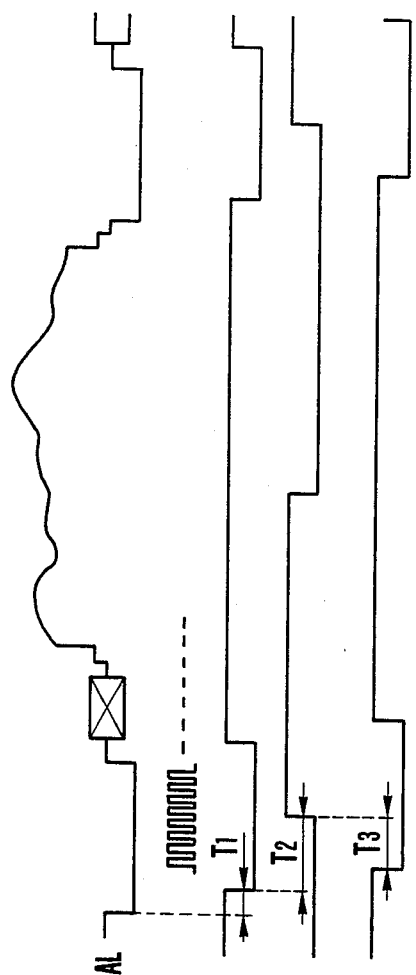
FIG. 7 is a timing chart showing the output waveforms of various parts of FIG. 6.

FIG. 7 shows, in a timing chart, the waveforms of the outputs of various parts of FIG. 6. In FIG. 7, a part "a" represents a video signal applied to the horizontal synchronizing signal separation circuit 2; a part "b" represents a clock (CLK) signal produced from the VCO 5; a part "c" represents the H-Sync signal; a part "d" represents a pulse signal (PDH) produced from a 1/n frequency divider 6; and another part "e" represents a horizontal synchronizing pulse (HD) produced from the pulse forming circuit 7. A reference symbol T1 denotes a time difference between the H-Sync signal before being separated and the same signal after having been separated; a symbol T2 denotes a time difference between the H-Sync signal and the pulse signal PDH obtained when the phase-locked circuit 12 is in a phase-locked state; and a symbol T3 denotes a time difference provided between the signal PDH and the pulse HD for the purpose of negating the time difference between the time difference T1 and T2.

The phase comparator 4 compares the phase of the incoming H-Sync signal and that of the signal PDH and serves to cause a phase difference T2 thus found between them to become constant. However, the H-Sync signal received at the phase comparator 4 does not precisely coincide with the H-Sync signal contained in the video signal before separation and has its phase normally delayed to an extent T1 corresponding to the separated part. Besides, this extent of delay T1 varies with the wave-form of the video signal and the method employed for separation. It is, therefore, difficult to precisely compensate for the extent of delay T1+T2 along with the time difference T3 provided between the signal PDH and the pulse HD.

Further, to compensate for the delay at the LPF 21 or the AMP 22, an offset voltage must be arranged within the AMP 22. However, at the phase-locked circuit, 12 there is a gain of 60 to 70 dB for a DC signal. Therefore, the provision of the offset voltage would not bring about any tangible change in the timing for generating the signal PDH. Further, the LPF 21 is concerned in a follow-up characteristic for the time-base variations (or jitter) in the H-Sync signal of the phase-locked circuit. Therefore, the LPF 21 is not usable for changing the delay of the signal PDH. Such being the situation, it is extremely difficult to have the extent of delay adjusted by means of the LPF 21 or the AMP 22.

Figure 8:
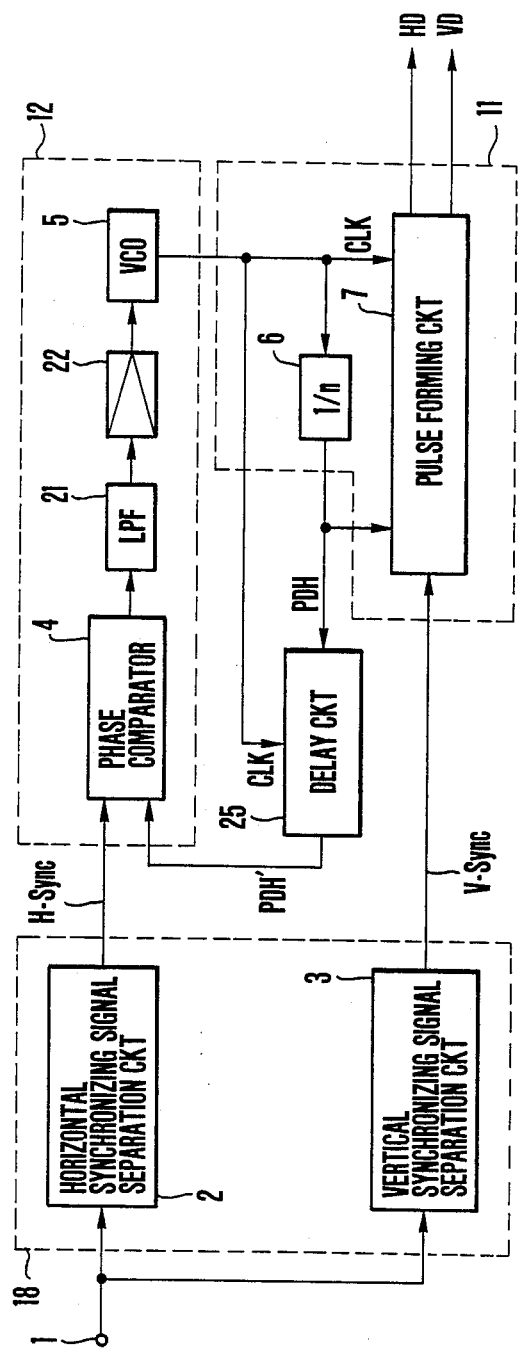
FIG. 8 is a diagram showing a synchronizing pulse signal generation device arranged according to this invention as another embodiment thereof.

FIG. 8 shows in outline the arrangement of a synchronizing pulse generating device arranged according to this invention to make further improvement in respect of the above-stated problem. In FIG. 8, the same reference numerals as those used in FIG. 6 denote elements which perform functions similar to those of the corresponding elements shown in FIG. 6 and they are omitted from the following description: In the case of this embodiment, the horizontal synchronizing signal PDH, which is to be synchronized and is obtained by 1/n frequency dividing the output of the voltage controlled oscillator 5, is supplied to the phase comparator 4 through a delay circuit 25 which includes a shift register. As will be further described later, in addition to the signal PDH, the delay circuit 25 receives also the output (CLK) of the voltage controlled oscillator 5 as a pulse signal for driving the shift register.

Figure 9:
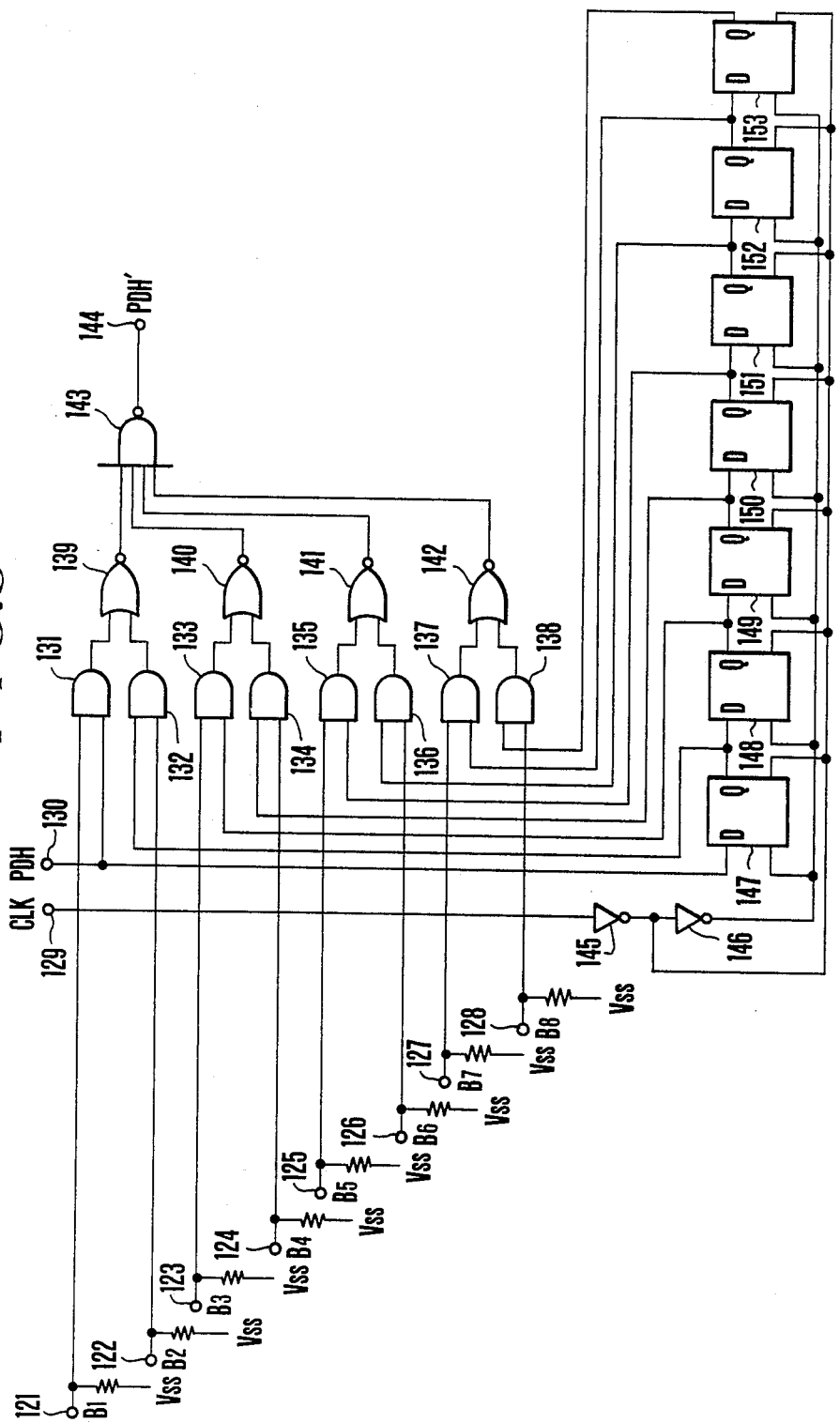
FIG. 9 is a circuit diagram showing, by way of example, the details of arrangement of a delay circuit shown in FIG. 8.

FIG. 9 is a circuit diagram showing, by way of example, the arrangement of the above-stated delay circuit 25 shown in FIG. 8. A terminal 129 is arranged to receive the clock (CLK) signal from the voltage controlled oscillator 5. The horizontal synchronizing signal PDH to be synchronized is supplied from the 1/n frequency divider 6 to another terminal 130. The signal PDH is processed through one of the terminals of an AND circuit 131 and D-type flip-flops 147 to 153 one after another. The signal PDH is then delayed for a period of time corresponding to one clock pulse period by one register to each step. The Q output of each of the flip-flops 147 to 153 is supplied to one of the input terminals of each of AND circuits 131 to 138. The outputs of these AND circuits 131 to 138 are supplied in pairs to NOR circuits 139 to 142 and, eventually, a horizontal synchronizing signal PDH' to be synchronized is obtained via a NAND circuit 143.

A high or low level signal from each of terminals 121 to 128 is supplied to the other input terminal of each of the AND circuits 131 to 138. Signals B1 to B8 are supplied to these terminals 121 to 128. The levels of these signals B1 to B8 are arranged to cause the output level of one of the AND circuits 131 to 138 to become high. In other words, the output level of the selected AND circuit becomes high only when the level of the other input, which is the signal PDH delayed for a period of time corresponding to a given number of clock pulses, becomes high. Then, the output level of the corresponding NOR circuit becomes low and that of the NAND circuit becomes high to make the level of the output signal PDH' high accordingly. In this instance, the delay time of the signal PDH is adjustable by time unit corresponding to the period of the clock pulses CLK with the level of one of the signals B1 to B7 selectively caused to become high.

Figure 10:
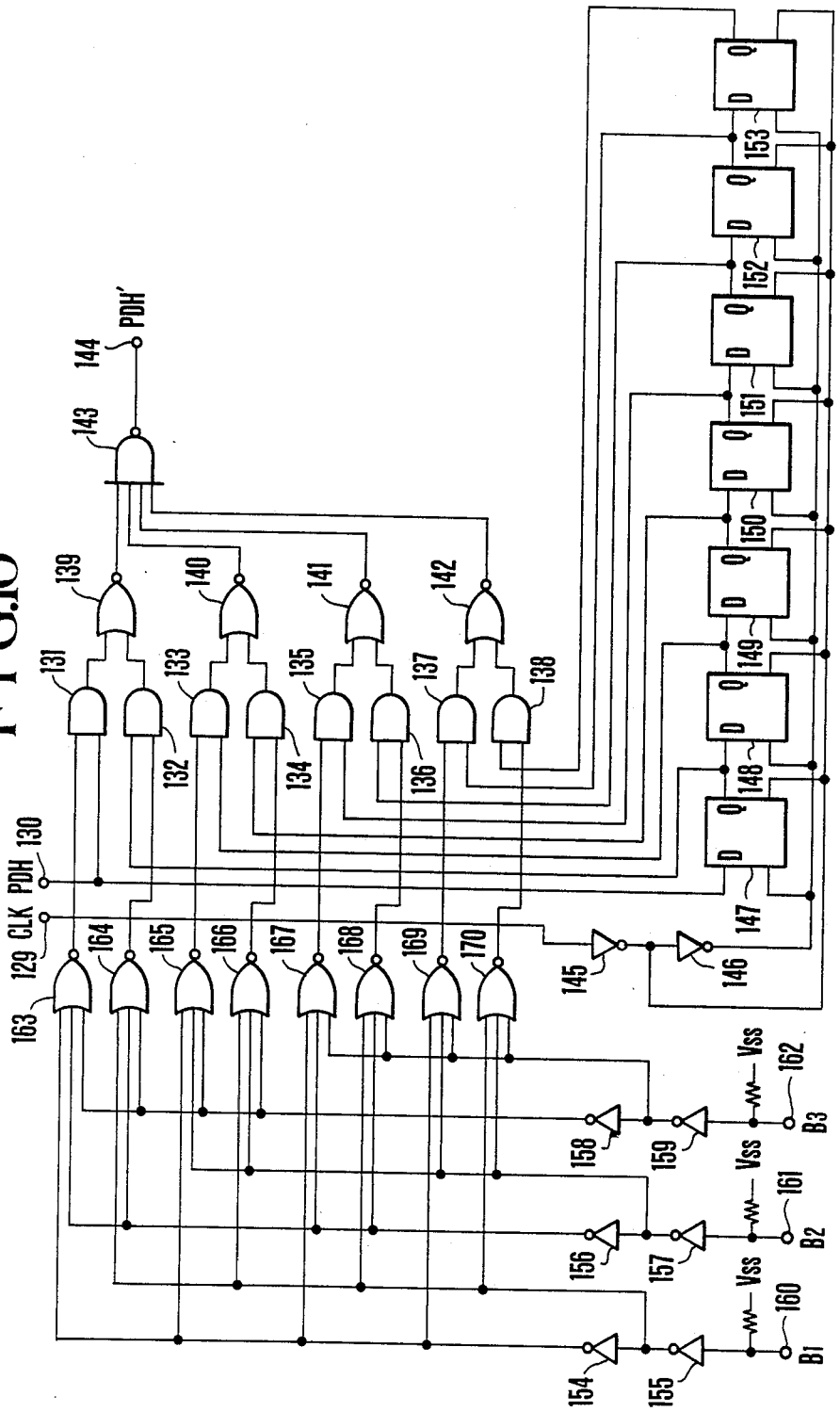
FIG. 10 shows another example of arrangement of the delay circuit of FIG. 8.

In the specific example given above, the delay time is controlled by using eight input terminals. In another example, the delay time is arranged to be controlled by means of input data of 3 bits as shown in FIG. 10. In FIG. 10, the elements indicated by the same reference numerals as those used in FIG. 9 perform functions similar to those of the corresponding elements of FIG. 9.

The signals for selection of the AND circuits 131 to 138 are supplied from NOR circuits 163 to 170. Meanwhile, the 3-bit data for determining which of the AND circuits 131–138 is to be selected is supplied to terminals 160, 161 and 162. The data or signals received at these terminals are supplied to NOR circuits 163 to 170 via inverter circuits 155, 157 and 159 and further via inverter circuits 154, 156 and 158 as applicable. The outputs of the inverter circuits 155, 157 and 159 and those of the NOR circuits 163 to 170 are in the following relation: Assuming that, in the 3-bit data, a signal B1 is the least significant bit and a signal B3 the most significant bit and that the 3-bit data makes the output of the NOR circuit 163 "0" and those of other NOR circuits "1", "2", ... one after another to make that of the NOR circuit 170 "7", the output level of only the applicable one of these NOR circuits becomes high while the output levels of all others become low. For example, if it is selected to make the output level of the NOR circuit 166 high, the output levels of the inverter circuits 155, 157 and 158 must be low. In that instance, the levels of the signals B1, B2 and B3 become high, high and low, respectively. They thus come to form a value 0 1 1 which represents "3". In accordance with the numbering method described above, this value corresponds to the NOR circuit 166. The method of this example is advantageous in cases where there are many taps as the control can be accomplished by means of data consisting of several bits.

Figure 11:
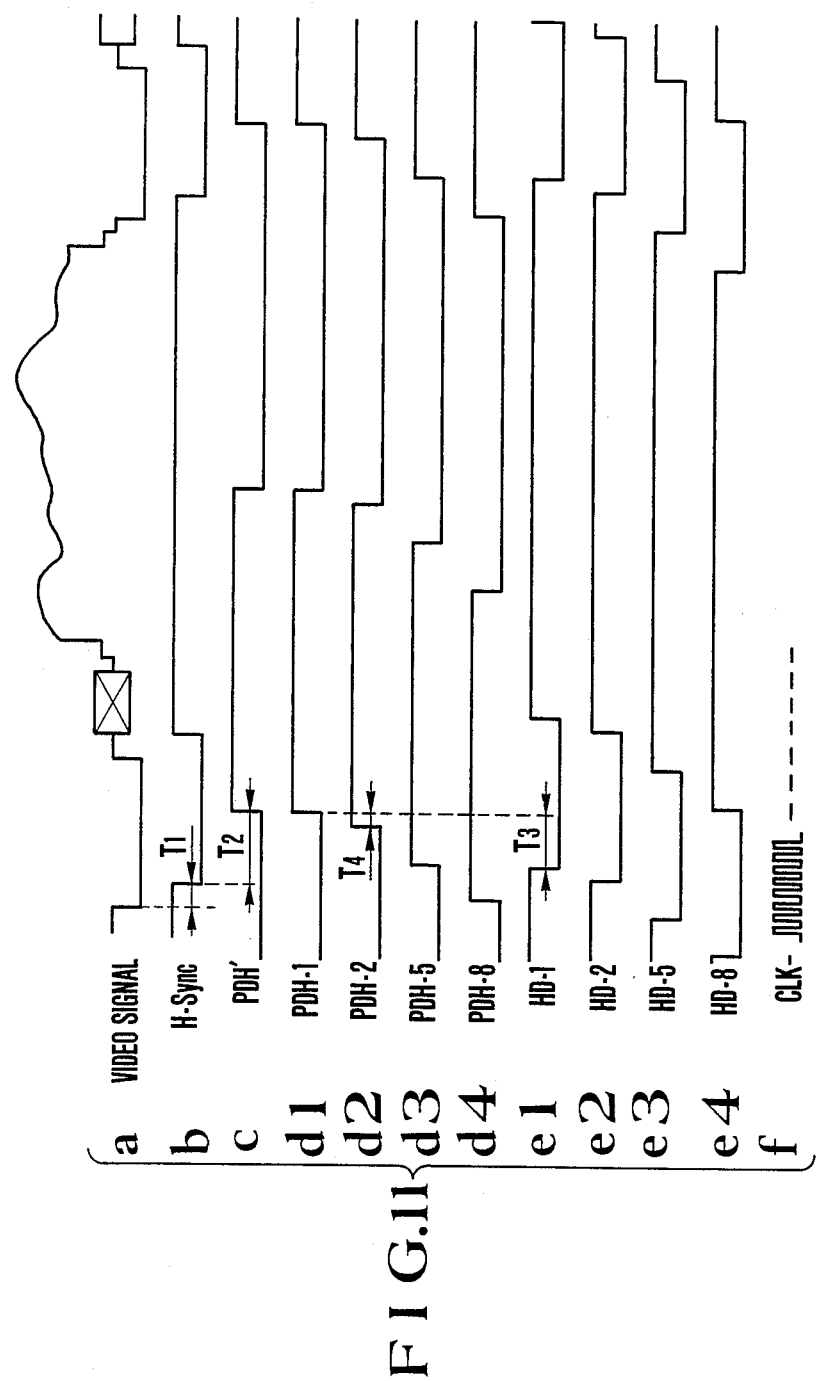
FIG. 11 is a timing chart showing the output waveforms of various parts of FIG. 8.

FIG. 11 shows, in a timing chart, the output waveforms of various parts of the synchronizing pulse generating device of FIG. 8. In the chart, a part "a" shows a video signal applied to the horizontal synchronizing signal separation circuit 2. A part "b" shows the H-Sync signal separated from the video signal by the circuit 2. A part "c" shows the signal PDH' which comes from the delay circuit 25 to the phase comparator 4 to be phase compared with the H-Sync signal. A part "d1" shows the signal PDH to be produced from the frequency divider 6 when the output levels of the selection terminals B1, B2 and B3 are low, low and low. A part "d2" shows the signal PDH produced from the frequency divider 6 when the output levels of these terminals B1, B2 and B3 are high, low and low, respectively. A part "d3" shows the signal PDH produced when the outputs of these terminals B1, B2 and B3 are at low, low and high levels, respectively. A part "d4" shows the signal PDH obtained when the output levels of these terminals B1, B2 and B3 are high, high, and high respectively. A part "e1" shows the signal HD obtained when the levels of B1, B2 and B3 are low, low and low, i.e. when the signal PDH is in the state as shown in the part "d1". A part "e2" likewise shows the signal HD obtained when the signal PDH is in the state of the part "d2". A part "e3" shows the signal HD obtained when the signal PDH is in the state of the part "d3". A part "e4" shows the signal HD obtained when the signal PDH is in the state of the part "d4". Another part "f" shows the clock pulses of the pulse forming circuit 7 and the delay circuit 25.

In accordance with the arrangement of the example given above, the time difference T4 is freely adjustable, so that the time difference T3 also can be readily adjusted.

In the arrangement described, the output of the voltage controlled oscillator 5 is used as the clock signal for the delay circuit 25. If this output is gradually increased to a certain extent for use as the clock signal, the delay time can be finely adjusted although such arrangement necessitates an increase in the number of the D flip-flops and control terminals. This arrangement then brings the timing of the H-Sync signal and that of the signal HD closer to each other.

Figure 12:
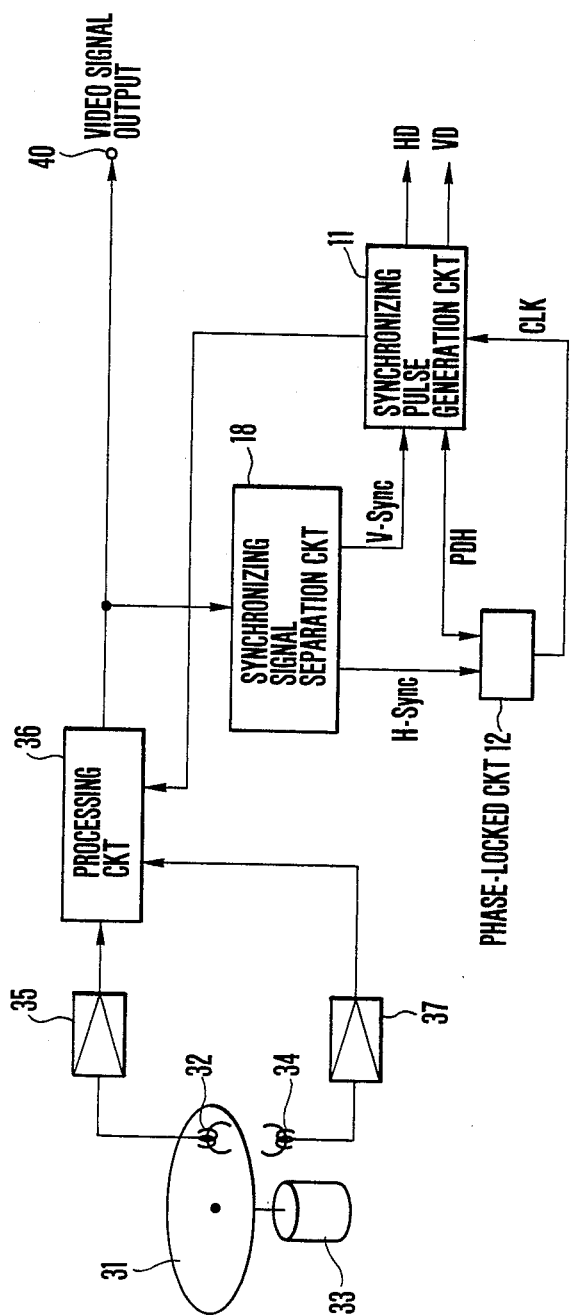
FIG. 12 is a diagram showing by way of example, a still picture reproducing apparatus to which this invention is applied.

The following description relates to a case where the synchronizing pulse generating circuit circuit which is arranged as described above, is applied to a still picture reproducing apparatus arranged to obtain a still picture by continuously reproducing one field portion of a video signal recorded in a circular track on a magnetic sheet: FIG. 12 shows in outline the arrangement of the still picture reproducing apparatus using the synchronizing pulse generating circuit according to this invention.

Referring to FIG. 12, a driving motor 33 is arranged to drive a magnetic sheet 31 to rotate, for example, at 3600 rpm in a fixed cycle. One field portion of a video signal which is recorded in a circular recording track on the sheet 31, is electromagnetically converted by a reproducing head 32. A reproduced signal thus obtained is supplied via a reproduction amplifier 35 to a processing circuit 36. Meanwhile, a rotation phase detection pulse signal, (hereinafter referred to as PG signal) which is obtained from a head 34, is supplied via an amplifier 37 also to the processing circuit 36. The reproduced signal is then converted into the form of a television (TV) signal through a signal processing operation including skew compensation, etc. Further, the processing circuit 36 is supplied with timing signals of varied kinds from the synchronizing pulse generating circuit 11 including a synchronizing signal for clamping, etc. The signal processed video signal thus obtained from the processing circuit 36 is supplied via a terminal 40 to an external monitor, etc. In this instance, the operating timing of the processing circuit 36 is determined by the timing pulses generated by the synchronizing pulse generating circuit 11. For example, in cases where the video signal amplified by the amplifier (AMP for short) 35 contains line sequential color difference signals, a timing for the operation of a coincidence circuit which is provided for demodulation of the line sequential color difference signals is determined by the timing pulses.

However, in the event of occurrence of the discontinuance of the video signal due to some reason, the group of timing signals and the synchronizing signals contained in the video signal comes out of matching among them. In the conventional apparatus, a counter is arranged to be rest by a V-Sync which comes first after the occurrence of the discontinuance. Until that point of time, however, it has been totally impossible to process the video signal. Further, although the timing of the H-Sync signal contained in the video signal is gradually matched to that of the timing signal, a long period of time has been required for the matching and it has been hardly possible to adequately process a video signal during that period.

Figure 13:
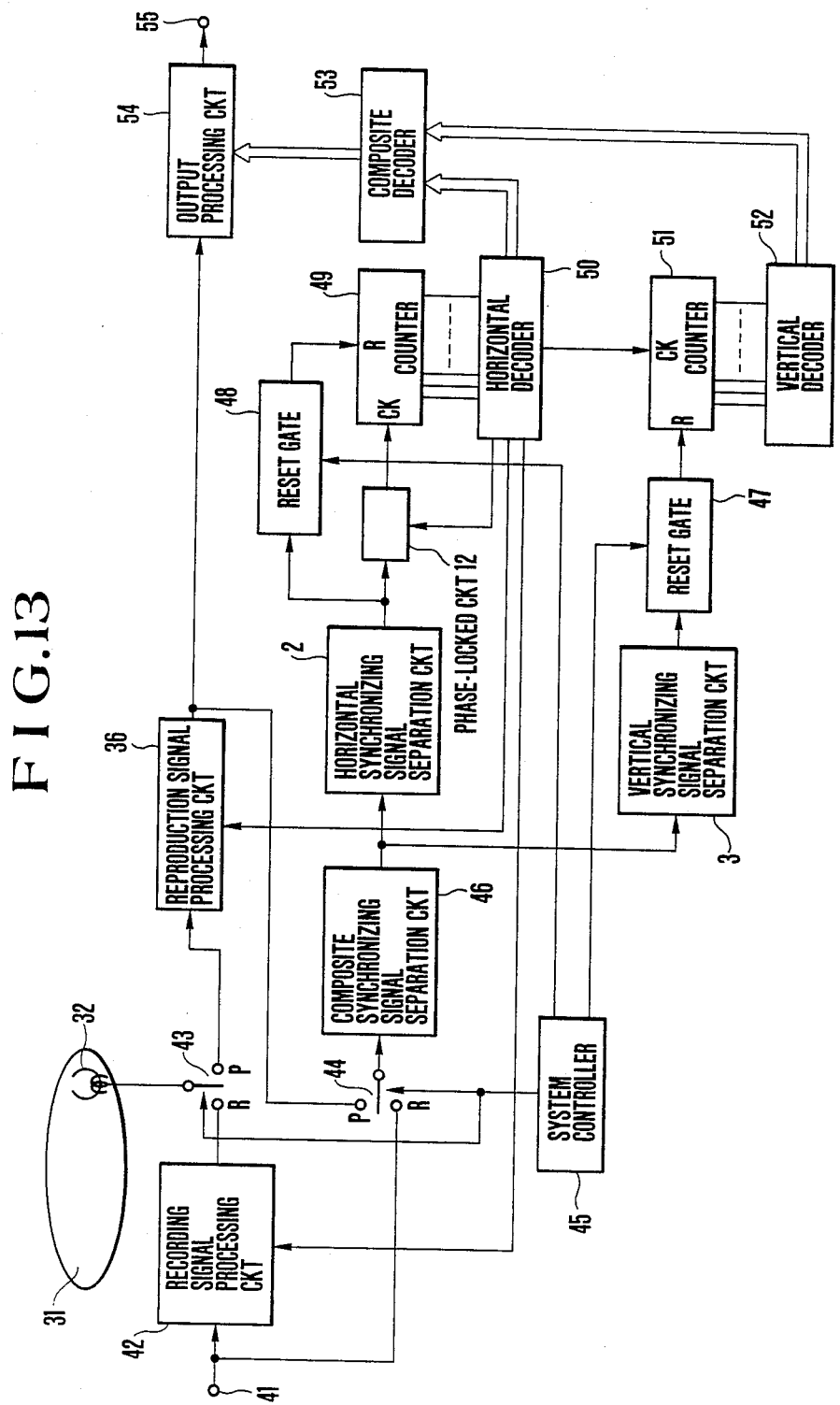
FIG. 13 is a diagram showing a video signal processing apparatus to which this invention is applied.

This problem is solved by a video signal processing apparatus which is arranged according to this invention as shown in FIG. 13. In FIG. 13, the same component elements as those shown in FIG. 12 are indicated by the same reference numerals. A video signal which contains synchronizing signals is supplied to a terminal 41. The incoming signal is then transformed into a signal form suited to recording by a signal processing circuit 42. The signal is supplied via the terminal R of a switch 43 to a head 32. One field portion of the video signal is then recorded in a circular track on a magnetic sheet 31. In the case of reproduction, the video signal is picked up by the head 32. The signal thus picked up is brought back into its original signal form by a reproduction signal processing circuit 36. The signal thus processed is further processed by an output processing circuit 54 into the form of a TV signal such as an NTSC signal. After that, as will be further described later, a synchronizing signal, which is obtained from a composite decoder 53, is added to the signal. A signal thus obtained is produced from a terminal 55.

A switch 44 is arranged to be connected to one side R thereof during recording and to the other side P during reproduction. The switch 44 thus allows a video signal to be supplied to the recording signal processing circuit 42 during recording and a video signal obtained from the reproduction signal processing circuit 36 to be produced. The video signal produced via the switch 44 is supplied, via a composite synchronizing signal separation circuit 46, to the horizontal synchronizing signal separation circuit 2 and the vertical synchronizing signal separation circuit 3.

The H-Sync signal, which is separated by the circuit 2, is supplied to the phase-locked circuit 12. The phase-locked circuit 12 then forms a high frequency clock signal which has its phase synchronized with the H-Sync signal, such as a clock signal of 260 fH (fH: horizontal scanning frequency). The high frequency clock signal thus formed is counted by a counter 49. The counter 49 is automatically reset when the counted value thereof reaches 260/n (n: an integer).

A horizontal decoder 50 is arranged to generate, by using the output of the counter 49, a group of timing signals coinciding with the timing of the H-Sync signal. These timing signals include, for example, a signal for forming a clamping pulse; a signal for forming a keyed pulse for automatic gain control (AGC), etc. The composite decoder 53 is arranged to receive also the counted data of the counter 49 among other data. Another counter 51 is arranged to receive counted pulses of frequency which is related to the H-Sync signal. Further, the horizontal decoder 50 is arranged to feed back to the phase-locked circuit 12 a frequency signal PDH which is of the frequency fH and is of the same timing as the H-Sync signal to be added later at the output processing circuit 54. With the signal PDH thus fed back to the phase-locked circuit 12, an automatic frequency control (AFC) is accomplished.

The counter 51 counts the counted pulses generated by the horizontal decoder 59 and is automatically reset upon completion of counting a number of the pulses corresponding to one field. With the counter 51 having been reset, a vertical decoder 52 generates a timing signal at a timing related to the V-Sync signal. This timing signal includes a change-over signal for change-over between first and second fields in case that the video signal is of the two fields-per-frame arrangement. The vertical decoder 52 is further arranged to supply the composite decoder 53 with the counted data of the counter 51, etc.

In response to the data supply, the composite decoder 53 generates a timing signal at a timing coinciding with the H-Sync and V-Sync signals. For example, this timing signal includes a composite synchronizing signal which is to be added to the reproduced video signal at the output processing circuit 54.

Conceivable causes for the occurrence of discontinuance of the video signal include change-over between recording and reproduction, a shift of the reproducing position of the head 32 from one circular track to another, etc. The change-over between recording and reproduction and the shift of the reproducing position of the head from one track to another, are performed under the control of a system controller 45. Immediately after the occurrence of discontinuance of the video signal due to one of these causes, the system controller 45 opens a reset gate 48 for one horizontal scanning period and another reset gate 47 for one vertical scanning period. As a result, immediately after the occurrence of discontinuance of the video signal, one reset pulse according to the H-Sync signal is supplied to the reset terminal of the counter 49 and one reset pulse according to the V-Sync signal to the reset terminal of the counter 51.

Therefore, even if the video signal becomes discontinuous, the timing of the group of timing signals produced from the horizontal decoder 50, the vertical decoder 52 and the composite decoder 53 precisely coincides with the H-Sync signal. This ensures that the signal processing operations of the recording signal processing circuit 42, the reproduction signal processing circuit 26 and the output processing circuit 54 can be always adequately accomplished.

What is claimed is:

1. A synchronizing pulse signal generation device, comprising:
   (A) first means for forming a clock pulse signal which is phase locked relative to a first periodic signal, said first means including:
      (a) a phase comparator which generates a phase error signal corresponding to a phase difference between two input signals, one of said two input signals being said first periodic signal;
      (b) a variable frequency oscillator; and
      (c) means for controlling an oscillation frequency of said variable frequency oscillator by selectively using a level of said phase error signal and a predetermined level; and
   (B) second means which uses said clock pulse signal together with a second periodic signal of a longer period than said first periodic signal for generating a pulse signal phase-locked relative to both said first and second periodic signals, said second means including means for generating a first pulse signal which is of the same period as said first periodic signal by using said clock pulse signal, said first pulse signal being supplied to said phase comparator as the other input signal of said phase comparator.

2. A device according to claim 1, wherein said first periodic signal is a horizontal synchronizing signal which is separated from a video signal, and said periodic signal is a vertical synchronizing signal which is also separated from said video signal.

3. A device according to claim 1, wherein said first pulse signal generating means includes a frequency divider which frequently divides said clock pulses.

4. A device according to claim 1, wherein said first pulse signal generating means includes a first counter which counts said clock pulses.

5. A device according to claim 4, wherein said first periodic signal is a pulse signal, and said first pulse signal generating means further includes first resetting means for resetting said first counter with said first periodic signal.

6. A device according to claim 5, wherein said first pulse signal generating means generates said first pulse signal in a phase-locked state relative to said first periodic signal on the basis of a count value of said first counter.

7. A device according to claim 6, wherein said second means further includes a second counter which counts the pulses of said first pulse signal.

8. A device according to claim 7, wherein said second periodic signal is a pulse signal, and said second means further includes a second resetting means for resetting said second counter by means of said second periodic signal.

9. A device according to claim 8, wherein said second means further includes means for generating a second pulse signal in a phase-locked state relative to said first periodic signal on the basis of a counter value of said second counter.

10. A synchronizing pulse signal generation device, comprising:
    (A) first means for forming a clock pulse signal which is phase locked relative to a first periodic signal, said first means including:
       (a) a phase comparator which generates a phase error signal corresponding to a phase difference between two input signals, one of said two input signals being said first periodic signal; and
       (b) a variable frequency oscillator which has an oscillation frequency thereof controlled on the basis of said phase error signal; and
    (B) second means which uses said clock pulse signal together with a second periodic signal of a longer period than said first periodic signal for generating a pulse signal phase-locked relative to both said first and second periodic signals, said second means including:
       (a) means for generating a first pulse signal which is of the same period as said first periodic signal by using said clock pulse signal; and
       (b) means for adjusting the phase of said first pulse signal.

11. A device according to claim 10, wherein said adjusting means includes a plurality of series connected delay circuits and a selection circuit which selectively produces output signals of said plurality of delay circuits.

12. A device according to claim 11, wherein said plurality of delay circuits are arranged to be driven by said clock pulse signal.

13. A device according to claim 10, wherein said first periodic signal is a horizontal synchronizing signal which is separated from a video signal, and said second periodic signal is a vertical synchronizing signal which is also separated from said video signal.

14. A device according to claim 10, wherein said first pulse signal generating means includes a frequency divider which frequency divides said clock pulses.

* * * * *